United States Patent [19]

Yuhara et al.

[11] Patent Number: 4,728,912

[45] Date of Patent: Mar. 1, 1988

[54] ELASTIC SURFACE WAVE DEVICE

[75] Inventors: Akitsuna Yuhara, Kawasaki; Jyun Sasaki; Takashi Shiba, both of Yokosuka; Jyun Yamada, Yokohama, all of Japan

[73] Assignee: Hitachi, Ltd., Tokyo, Japan

[21] Appl. No.: 809,181

[22] Filed: Dec. 16, 1985

[30] Foreign Application Priority Data

Dec. 14, 1984 [JP] Japan .................................. 59-262736

[51] Int. Cl.$^4$ .............................................. H03H 9/64
[52] U.S. Cl. .................................... 333/193; 333/154; 310/313 B
[58] Field of Search ............... 333/150, 151, 152, 153, 333/154, 155, 193-196; 310/313 R, 313 A, 313 B, 313 C, 313 D

[56] References Cited

U.S. PATENT DOCUMENTS

| 3,825,860 | 7/1974 | Carr ..................................... 333/151 |
| 4,146,808 | 3/1979 | Laker et al. ...................... 310/313 B |
| 4,315,228 | 2/1982 | Moore ................................. 333/193 |
| 4,390,807 | 6/1983 | Kishimoto et al. ............. 333/193 X |

FOREIGN PATENT DOCUMENTS 2234693  1/1973  Fed. Rep. of Germany .

OTHER PUBLICATIONS

Bristol, "Synthesis of Periodic Unapodized Surface Wave Transducers", IEEE Ultrasonics Symposium Proceedings, 1972, pp. 377-380.
Budreau, "Narrow Band Surface Wave Filters at 1 GHz", IEEE Ultrasonics Symposium Proceedings, 1972, pp. 218-220.

Primary Examiner—Eugene R. LaRoche
Assistant Examiner—Seung Ham
Attorney, Agent, or Firm—Antonelli, Terry & Wands

[57] ABSTRACT

In an elastic surface wave device comprising a piezoelectric substrate, a first transducer group, and a second transducer group or groups located on one or both sides of the first transducer group to exchange elastic surface waves with the first transducer group, the second transducer group comprises a plurality of transducers sharing the same elastic surface wave propagation path. The geometrical central positions of the individual transducers making up the second transducer group are located symmetrically about the geometrical central position (0—0') of the entire second transducer group, with each pair of such symmetrically located transducers incorporating the same number of pairs. The delay time, that is, the time taken by elastic surface waves propagating between the centers of every two adjoining transducers, excluding the two outermost transducers, is constant ($\tau$). The distance between the center of each of the two outermost transducers and that of the transducer adjoining the outermost transducer is determined such that the delay time taken between the two transducers is, if the number of pairs incorporated in the outermost transducer is an integer, equal to an odd-number multiple of one-half of the above-mentioned constant delay time ($\tau$), or, if the number of pairs incorporated in the outermost transducer is not an integer, equal to an odd-number multiple of one-half of the above-mentioned constant delay time ($\tau$), plus or minus a quater wavelength time.

4 Claims, 4 Drawing Figures

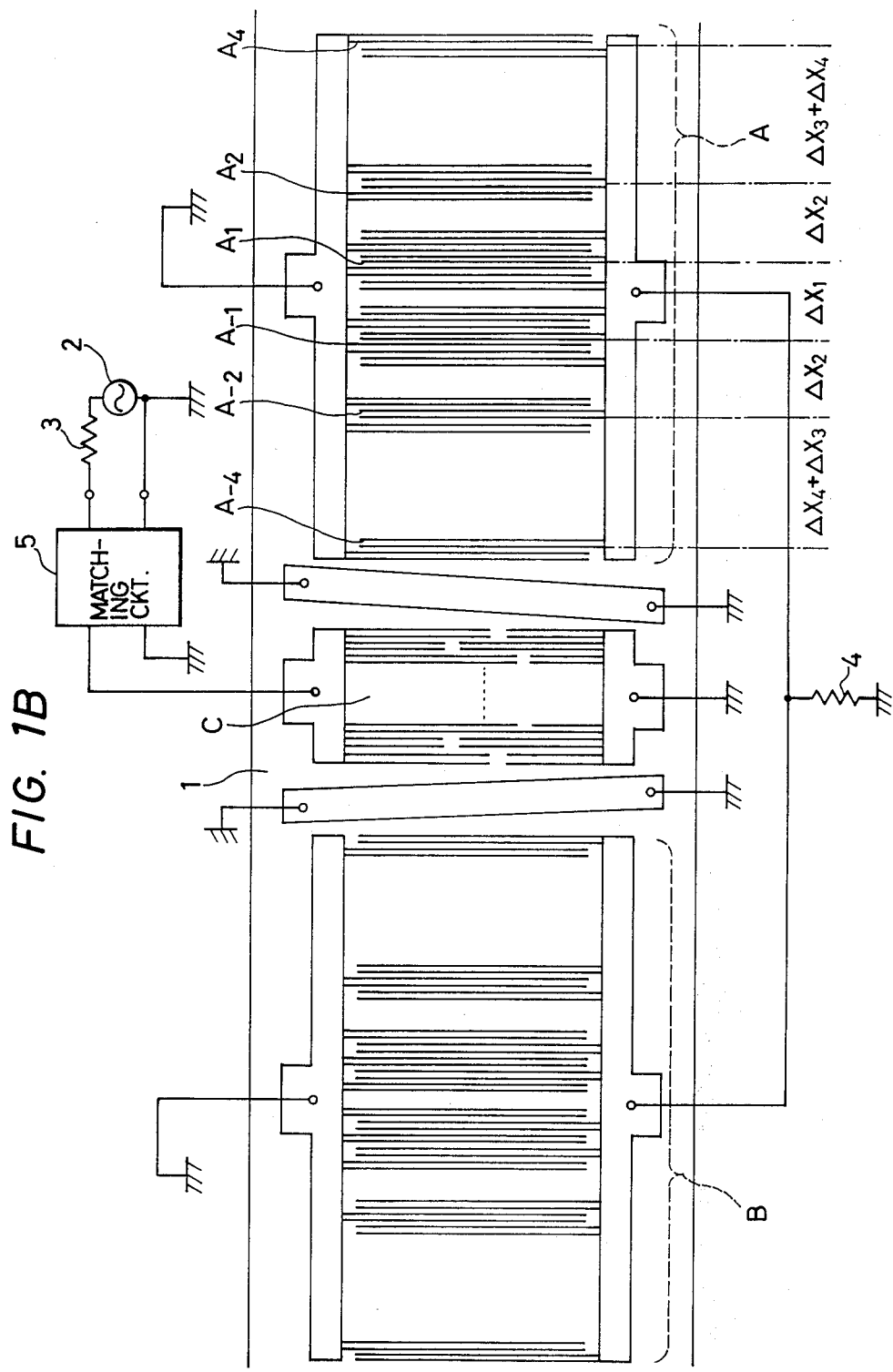

ELASTIC SURFACE WAVE DEVICE

BACKGROUND OF THE INVENTION

The present invention relates to a high-frequency, low-loss elastic surface wave device featuring a superior band-pass characteristic shape factor, stop-band rejection capability and ripple characteristic.

Elastic surface wave devices having a transducer configuration in which apodized transducers and unapodized transducers are combined to obtain desired amplitude-frequency characteristics have been most commonly used because characteristics of the total system can be given easily as a product of the amplitude-frequency characteristics of each transducer incorporated in the device. Hence, it is easy to design elastic surface wave devices having such a transducer configuration. Aside from such a conventional transducer configuration in common use, a phase-weighted transducer configuration comprising a group of transducers all arranged with an equal overlapping length on the same propagation path has also been proposed; and a transducer configuration in which such phase-weighted transducers are substituted for apodized transducers or in which such phase-weighted transducers, instead of unapodized transducers, are combined with apodized transducers has also been in use in some sectors.

Of the foregoing conventional types of elastic surface wave devices, those employing a transducer configuration in which unapodized transducers and apodized transducers are combined have the following disadvantages:

(1) It is difficult to adequately suppress stop-band response signals. Particularly, if a small number of pairs of high-impedance unapodized transducers with a bandwidth sufficiently larger than required are used for an elastic surface wave device, the desired stop-band rejection has to be achieved only with apodized transducers. As a result, a larger number of pairs of apodized transducers are required and hence a larger substrate area is required. Furthermore, such disadvantageous features of the elastic surface wave device result in greater effects of diffraction caused where transducer overlapping lengths are small, to eventually allow stop-band response signals to grow larger. If unapodized transducers with a bandwidth which is not so much larger than required by the elastic surface wave device are used, the effects of their traps (poles) and side lobes promote stop-band rejection for the entire device; but since the effect of diffraction cannot be totally eliminated, stop-band rejection cannot be promoted as much as expected depending on the case. The problem of stop-band rejection assumes still greater significance particularly for a low-loss elastic surface wave device to be used in a state in which its transducers are nearly matched with the power supply or load. At lower-order side lobes near the pass band, the radiation conductance of transducers is not necessarily small enough with respect to the internal conductance of the generator, and also the imaginary part (susceptance) is canceled in a state in which conjugate matching is nearly achieved; so that the relative magnitudes of lower-order side lobes noticeably increase.

(2) The impedances of unapodized transducers cannot be set as desired. Particularly, if a high frequency filter configuration with a small fractional bandwidth is employed to attempt stop-band rejection enhancement using unapodized transducers with a bandwidth which is not so much larger than required, the number of transducer pairs required increases. Furthermore, in such a case, to avoid excessive growing of the effects of diffraction waves generated where apodized transducer overlapping lengths are small, the aperture cannot be narrowed; so that greater radiation conductance and susceptance result. If, for example, a band-pass filter system with a center frequency $f_0$ of 402.78 MHz and a 3-dB attenuation bandwidth of 30 MHz is created using a lithium niobate ($LiNbo_3$) single crystal substrate of 128° rotated Y-axis cut and X-axis propagation; 59.5 pairs of apodized transducers and 13 pairs of unapodized transducers are required, and it is necessary to use split fingers. If the aperture is set to 300 $\mu$m in this case, the radiation conductance of apodized transducers will be about 4 mS and that of unapodized transducers about 6 mS. If such a filter is used in an ordinary two-transducer configuration with an outer-circuit conductance of 20 mS (for a 50-$\Omega$ system), the so-called regeneration by the load or power supply will cause multiple transit signals to be actively generated, to eventually allow heavy rippling. The stop-band rejection magnitude in this case will be only about 32–34 dB at a frequency about 40 MHz off the center frequency; the stop-band rejection deterioration caused by diffraction is about 10–15 dB with respect to the design value. Under such conditions, it is impractical to further narrow the aperture, so that it is impossible for practical purposes to reduce the radiation conductance. If a three-transducer configuration is adopted for loss reduction, the central transducer has to be matched with the outer circuit, whereas, for the outer transducers, it is necessary to reduce their radiation conductance to about one-tenth of the outer-circuit conductance in order to suppress multiple transit signals in the entire bandwidth. If the outer-circuit conductance is 20 mS, standard value, in such a case, the central transducer can be matched with the outer circuit by using an impedance matching circuit network or by appropriately adjusting the aperture length; but the radiation conductance of the outer transducers cannot be set to a desired value without using a circuit network which causes impedance mismatching. Such condition is to be observed whether apodized transducers and unapodized transducers are used as the central transducers or as the outer transducers. Using a small number of pairs of unapodized transducers as the outer transducers enables the radiation conductance of the outer transducers to be set as desired, but it makes stop-band rejection more difficult.

What are regarded as phase-weighted transducers making up the conventional elastic surface wave devices can be classified into the following three categories:

(a) Those consisting of a number of unapodized transducer groups which are equally spaced and are connected in series or parallel, with each group including the same number of pairs of unapodized transducers. This category of phase-weighted transducers include those described in the following information;

(a-1) U.S. Pat. No. 3,550,045 (R. Adler)
(a-2) U.S. Pat. No. 3,600,710 (R. Adler)
(a-3) U.S. Pat. No. 3,825,860 (Paul H. Carr)
(a-4) 1972, IEEE Ultrasonics Symposium Proceedings, p. 218–220, Alan J. Budreau and Paul H. Carr, Narrow Band Surface Wave Filters at 1 GHz.
(a-5) U.S. Pat. No. 3,846,723 (Philip L. Writer, et al.)

(b) Those adopting a transducer configuration which comprises unapodized central transducers, on both sides of which other unapodized transducers are symmetrically arranged with equal spacing from the central position of the central transducer group. This category of phase-weighted transducers include those described in the following information;

(b-1) U.S. Pat. No. 3,792,381 (T. W. Bristol)

(b-2) 1972, IEEE Ultrasonics Symposium Proceedings, p. 377-380, T. W. Bristol, Synthesis of Periodic Unapodized Surface Wave Transducers.

(c) Those comprising transducers which overlap each other with an equal overlapping length, with parts of fingers withdrawn. This category of phase-weighted transducers include those described in the following information;

(c-1) Japanese patent application laid open No. 14093 of 1974 (Sekine)

(c-2) U.S. Pat. No. 3,946,342 (C. W. Hartmann) (Japanese patent application laid open No. 40259 of 1975)

(c-3) 1973, IEEE Ultrasonics Symposium Proceedings, p. 423-426, C. S. Hartmann, Weighting Interdigital Surface Wave Transducers by Selective Withdrawal of Electrodes.

Of the foregoing three categories of existing phase-weighted transducers, those belonging to the category (a) all concern simple, narrow-band filter configurations or filter configurations with a bandwidth including peaks and troughs. They do not incorporate any consideration for stop-band response signal suppression, shape factor improvement for the pass-band frequency response, frequency response improvement by means of a combination of phase-weighted transducers and apodized transducers, and loss reduction; so that such improvements cannot be realized by them.

Next, those belonging to the above category (b) adopt a transducer configuration comprising central unapodized transducers adjoined by reverse-phased unapodized transducers on both sides. Such a transducer configuration is aimed at canceling the primary side lobe of unapodized transducers while enhancing the flatness of the band-pass characteristic. Generally, however, enhancement of stop-band rejection on transducers, by means of canceling the primary side lobes generated by unapodized transducers, and improvement of the flatness of the band-pass characteristic cannot be pursued at the same time; hence a problem with the above-mentioned transducer configuration is that it enables both targets to be pursued at a time only when a particular pair ratio is realized between the central unapodized transducers and other unapodized transducers adjoining the central transducers on their both sides. Furthermore, since the bandwidth is determined by the number of pairs of central unapodized transducers, the radiation conductance cannot be easily controlled. In other words, a smaller fractional bandwidth for high frequencies results in larger radiation conductance as previously mentioned. Therefore, the transducer configuration identified with the foregoing category (b) is not suitable when a small high-frequency, fractional bandwidth is involved.

Lastly, it is very difficult to design the phase-weighted transducers belonging to the foregoing category (c), because it is not known how to control the radiation conductance and bandwidth, or how to determine the band shape for them. They have another drawback which is common to all the three categories of transducers. That is, the difference in elastic surface wave speed between the locations where unapodized transducers are arranged at equal pitches and where fingers are removed is not taken into account; so that there are cases in which their applications result in bandwidth characteristic shape and frequency errors.

SUMMARY OF THE INVENTION

An object of the present invention is to provide an elastic surface wave device incorporating transducers, whose design is relatively simple and which enables stop-band response signal rejection and pass-band characteristic improvement for loss reduction, radiation conductance control on transducers, and arbitrary bandwidth setting. Another object of the present invention is to provide an elastic surface wave device which, adopting an ordinary two-transducer configuration, enables pass-band characteristic and skirt characteristic improvements and stop-band response signal rejection.

The above objects can be attained by the present invention. According to present invention, in an elastic surface wave device comprising a piezoelectric substrate, a group of transducers disposed on the substrate and a second group of transducers which are located on one or both sides of the first group of transducers to exchange elastic surface waves with them, the second transducer group is composed of two or more transducers sharing the same elastic surface wave propagation path.

The geometrical central positions of the individual transducers making up the second transducer group are located symmetrically about the geometrical central position of the entire second transducer group. A number of pairs in the transducers such symmetrically located with each other is equal with each other. The delay time, that is, the time taken by elastic surface waves propagating between the centers of any two adjoining transducers, excluding the two outermost transducers, is constant. The distance between the center of each of the two outermost transducers and that of the transducer adjoining the outermost transducer is determined such that the delay time taken between the two transducers is, if the number of pairs incorporated in the outermost transducer is an integer, equal to an odd-number multiple of one half of the above-mentioned constant delay time, or, if the number of pairs incorporated in the outermost transducer is not an integer, equal to an odd-number multiple of one half of the above-mentioned constant delay time, plus or minus a quarter wavelength time. The electric outputs of the transducers sequentially different in phase are added up through series or parallel connections, so that while the main peaks, sub peaks and traps attributable to interferences periodically appear along the frequency axis, one main peak coincides with or comes close to the center frequency $f_0$ of the first transducer group with the sub peaks and traps coming near the lower-order side lobes.

In order to improve the shoulder and skirt characteristics of the main peak coinciding with the above-mentioned center frequency $f_0$ for improving the shape factor of the amplitude-frequency characteristic, to lower the sub peaks in the neighborhood of the pass-band of the main peak coinciding with the $f_0$, and to reduce the ratio between the pass-band and stop-band widths, that is, to obtain the wider stop-band width, the following measures are applied to the second transducer group:

(i) The transducers are arranged so that constant delay time $\tau$ is taken between the geometrical centers of every two adjoining transducers (so as to enable simpler design), excluding the two outermost transducers. The main peaks and sub peaks are generated by the transducers excluding the outermost transducers, and small subpeak amplitudes, which are small enough with respect to arbitrary narrow band width and amplitude of the main peaks, are realized with each transducer incorporating a small number of pairs.

(ii) In order to reverse the polarity of the two outermost transducers and, to most efficiently suppress the subpeaks generated by the transducers other than the two outermost transducers, the distance between the center of each of the two outermost transducers and that of the transducer adjoining the outermost transducer is made unequal to the distance between the centers of adjoining transducers among those excluding the two outermost transducers. Namely, it has been found that arranging each of the two outermost transducers so as to cause the delay time taken between its center and the center of the transducer adjoining it to be equal to an odd-number multiple of one half of the before-mentioned constant delay time $\tau$ is very effective in suppressing sub peaks and also in bringing the main-peak pass-band characteristic closer to a rectangular characteristic. When the number of pairs incorporated in each of the two outermost transducers is not an integer, that is, if the number is a half-integer, the distance between the outermost transducer and the transducer adjoining it is made such that the delay time taken between the two transducers is equal to an odd-number multiple of one half of the before-mentioned retardation time $\tau$ plus or minus the time corresponding to a quarter of the elastic surface wavelength so as not to disarrange the pass-band characteristic symmetry about the $f_0$.

According to the present invention, the second group of transducers are capable of defining the filter band characteristic by themselves. Therefore, apodization on the first group of transducers can be made exclusively for the purpose of realizing conjugate matching with the external matching circuits in the entire bandwidth. It has therefore been found that the present invention enables multiple transit signals to be adequately suppressed in the entire bandwidth.

BRIEF DESCRIPTION OF THE DRAWINGS

In the accompanying drawings

FIG. 1B is a schematic plan representing an embodiment according to the present invention;

DETAILED DESCRIPTION OF PREFERRED EMBODIMENT

An embodiment of the present invention will be explained in detail in the following.

First, the theory of operation of the second group of transducers will be explained based on a fundamental configuration example.

Figure 1A:
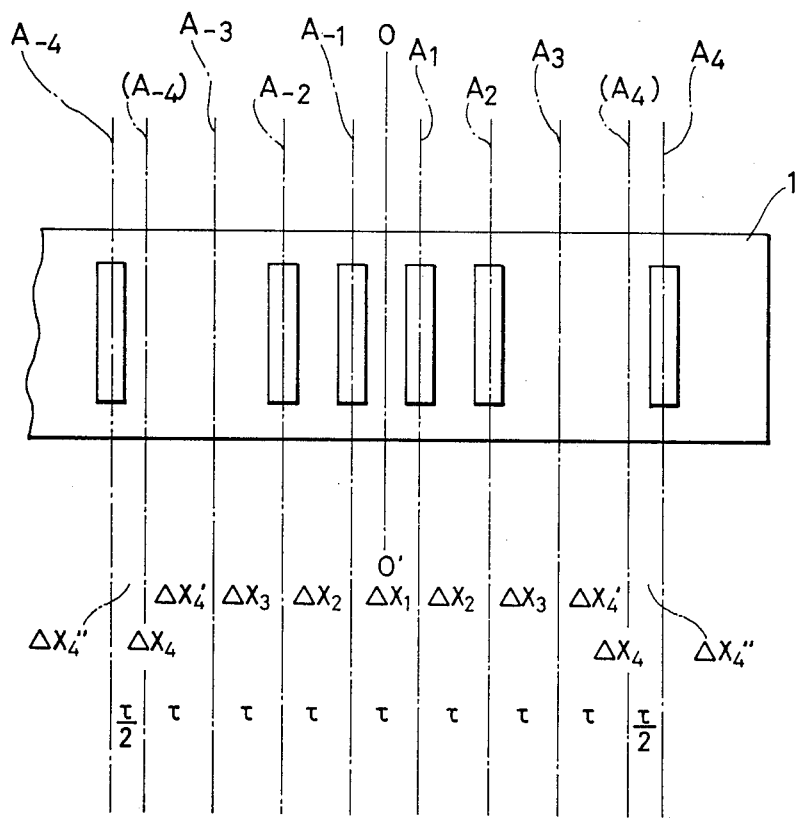
FIG. 1A is a schematic plan of fundamental configuration example for use in explaining the theory of the present invention.

FIG. 1A shows an example of a fundamental configuration of the second group of transducers mentioned above. The configuration comprises six transducers, $A_{-4}$, $A_{-2}$, $A_{-1}$, $A_1$, $A_2$, and $A_4$, whose aperture lengths are equal and which share the same propagation path. The six transducers are arranged symmetrically about the center 0—0' of the second transducer group. Each pair of such symmetrically arranged transducers, $A_{-1}$ and $A_1$, $A_{-2}$ and $A_2$, or $A_{-4}$ and $A_4$, each incorporate the same number of pairs of transducer elements. In the configuration, transducers $A_{-3}$ and $A_3$ do not exist (the number of pairs is 0). The delay time taken between adjoining transducers (excluding the two outermost transducers), that is, between transducers $A_{-2}$ and $A_{-1}$, $A_{-1}$ and $A_1$, $A_1$ and $A_2$ is a constant time $\tau$. The distance between each of the two outermost transducers $A_{-4}$, $A_4$ and the one adjoining it is not such that the delay time taken between them is equal to an integer multiple of the before-mentioned constant delay time $\tau$. The distance between $A_{-4}$ and imaginary transducer $A_{-3}$ or between $A_4$ and imaginary transducer $A_3$ is such as to cause delay equal to $1.5\tau$, that is, an odd-number multiple of one half of the constant delay time $\tau$; so that the distance between $A_{-4}$ and an inner transducer $A_{-2}$, or between $A_4$ and an inner transducer $A_2$ is such as to cause delay equal to $2.5\tau$. The second group of transducers are designed to receive the elastic surface waves coming from the first group of transducers that are not shown in FIG. 1A. It is therefore necessary to correctly position the transducers duly taking into consideration the elastic surface wave speed on a free surface and the effective speed in the transducer section; so that the foregoing retardation time $\tau$ is always constant and also so that the absolute value of $\tau$ agrees with the target value.

The responses made by the transducers shown in FIG. 1A in operation are as follows; explanation is made, not with respect to angular frequency, but with respect to the phase difference $2\theta$ beteen the centers of adjoining transducers excluding the two outermost transducers.

$$F(\theta) = \frac{1}{a_1 + a_2 + a_4} \{a_1\cos\theta + a_2\cos 3\theta + a_4 \cos 8\theta\} \quad (1)$$

$$2\theta = w/2\pi \quad (2)$$

In the above equation (1), $a_1$ ($=a_{-1}$), $a_2$ ($=a_{-2}$), and $a_4$ ($=a_{-4}$) represent the output amplitudes of the transducers, $A_1$ ($A_{-1}$), $A_2$ ($A_{-2}$), and $A_4$ ($A_{-4}$), respectively, and their values in primary appoximation are proportional to the respective numbers of pairs (with the same coefficient of proportion applied). If $a_1$ is greater than $a_2$ and $a_4$, the amplitude part of equation (1) represents a main peak when $\theta$ is equal to $n_A\pi$. The $\theta$ giving a main peak is designated as $\theta p$. The frequency $f_p$ that gives the peak value of the amplitude is:

$$f_p = n_A \cdot \Delta f_A \text{ (where } n_A \text{ is an integer)} \quad (3)$$

The main peak interval $\Delta f_A$ is appropriately set to make $f_p$ and the central frequency $f_0$ of the first transducer group coincide. When the value of $\theta$ corresponding to $f_0$ is $\theta_0$, the phase deviation $\delta\theta$ and frequency deviation $\delta f$ are related as follows:

$$\delta\theta = \theta - \theta_0, \text{ and } \delta f = f - f_0 \quad (4)$$

$$\delta\theta = (\delta f/f_A)\pi \quad (5)$$

If $\theta$ in equation (1) is replaced by $\delta\theta$, the following equation is obtained:

$$F(\delta\theta) = \frac{1}{a_1 + a_2 + a_4} \{a_1\cos\delta\theta + a_2\cos3\delta\theta + a_4\cos8\delta\theta\} \quad (6)$$

If transducers $A_{-1}$ and $A_1$ incorporate 3 transducer pairs each, $A_{-2}$ and $A_2$ incorporate 2 pairs each, $A_{-4}$ and $A_4$ incorporate 0.5 pair each, respectively, and if their polarity is reversed; the value of $a_1$ becomes 6, $a_2$ becomes 4, and $a_4$ becomes −1, respectively. In this case, the position of each of the outermost transducers $A_{-4}$ and $A_4$ is shifted by the distance corresponding to a quarter wavelength time toward (or away from) the center 0—0′ in order to make the phases of the transducers $A_{-4}$ and $A_4$ correctly coincident with that of other transducers $A_{-2}$, $A_{-1}$, $A_1$ and $A_2$, at the center frequency $f_0$. The amplitude part of the equation can then be expressed as follows:

$$F(\delta\theta) = \frac{1}{9}\left( 6\cos\delta\theta + 4\cos3\delta\theta - \cos\frac{63}{8}\delta\theta \right) \quad (7)$$

The first and second terms in the above equation reduce the sub-peak amplitude, whereas the main-peak shape factor remains unimproved. When the third term for subtraction is added to them, the sub peak in the neighborhood of the main peak is efficiently lowered and, at the same time, the stop-band is expanded to improve the shape factor of the main peak.

Figure 2:
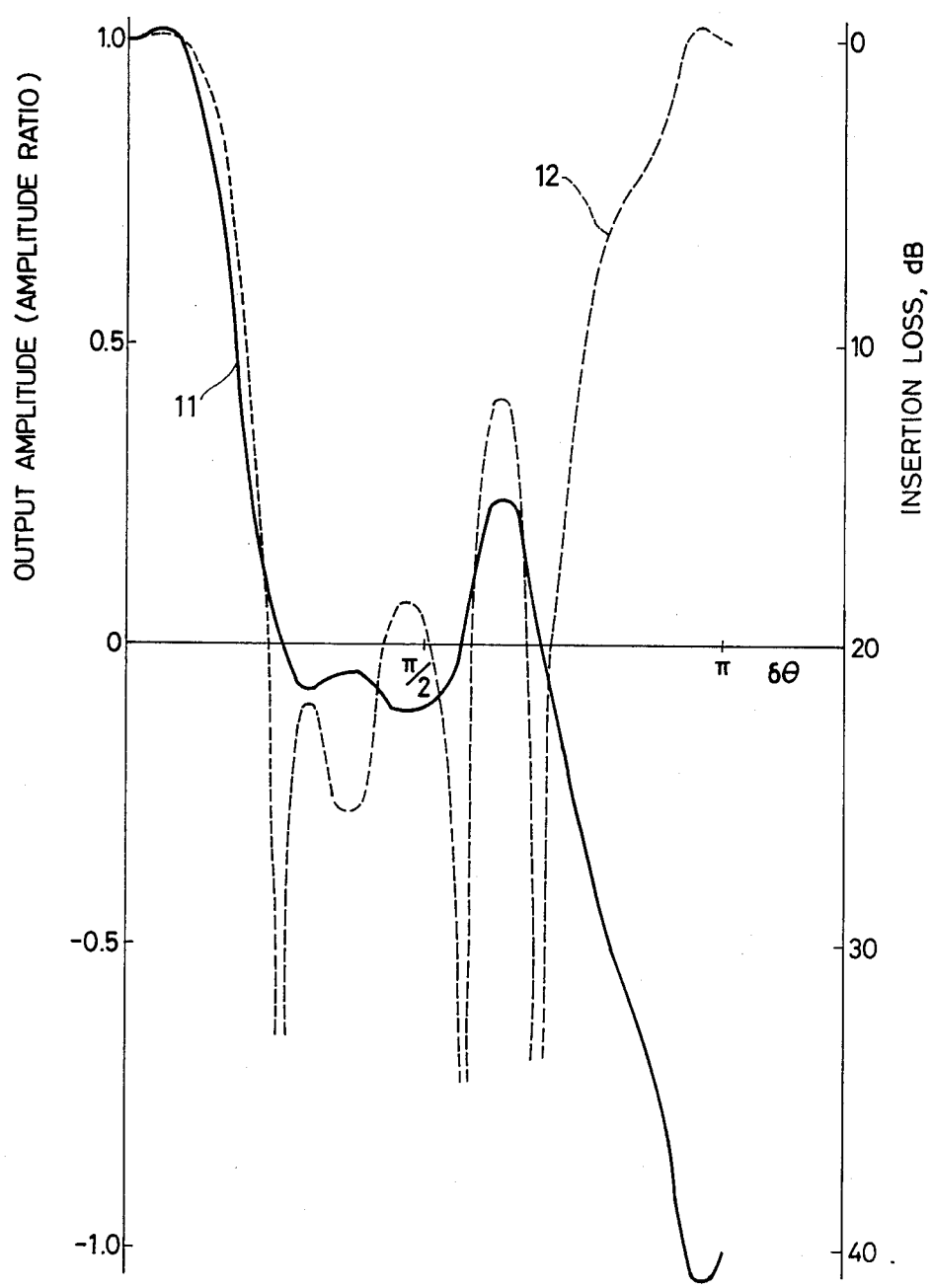
FIG. 2 is a drawing representing the output amplitude characteristic of the transducer group which is included in the theoretical configuration example shown in FIG. 1A.

FIG. 2 shows the characteristic represented by equation (7), with the value of the amplitude part, $F(\delta\theta)$, laid off the ordinate axis and the values of $\delta\theta$ along the abscissa axis. The figure represents the frequency characteristic of output amplitudes of the second group of transducers configured as shown in FIG. 1A. The $F(\delta\theta)$ is symmetrical about the position of $\delta\theta=0$. In FIG. 2, the curve 11 represents values relative to the linear scale; and dotted-line curve 12 represents values in dB. Their shape factors are superior with the in-band flatness being 0.2 dB and the shoulders and skirts sharply shaped. In the neighborhood of the pass-band, an independent stop-band rejection of 20 dB or more is possible. The ratio between the pass-band width (trap interval) and stop-band width could be brought close to a ratio of 2:1.

Now an embodiment of the present invention based on the fundamental configuration shown in FIG. 1A will be explained with reference to the schematic plan shown FIG. 1B. The substrate 1 shown in FIG. 1B is a piezoelectric substrate made of a lithium niobate (LiNbO₃) single crystal of 128° rotated Y-axis cut and X-axis propagation. The first transducer group C disposed on the piezoelectric substrate 1 comprises 59.5 pairs of symmetrically apodized transducer elements with a center frequency $f_0$ of 402.78 MHz, a 3-dB attenuation bandwidth of 30 MHz, and an aperture length of 300 μm. Located on both sides of the first transducer group C, along the extension of the propagation path are the second transducer groups A and B, each of which satisfies the foregoing equation (7) for the fundamental transducer configuration example; they are set to the same aperture length as the first transducer group C. In this embodiment, the main peak is the one corresponding to $n_A=4$ with respect to frequency 0; the value of $\Delta f_A$ is 100.695 MHz, $\Delta_{x1}$ 39.5 μm, $\Delta_{x2}$ 39.53 μm, and ($\Delta_{x3}+\Delta_{x4}$) 96.475 μm; where $\Delta_{x1}$ $\Delta_{x2}$, $\Delta_{x3}$, and $\Delta_{x4}$ represent intertransducer distances as shown in FIG. 1A. At frequency $f_0$, the transducers $A_{-4}$ and $A_4$ receive waves at opposite phase with respect to the transducers $A_{-1}$, $A_1$, $A_{-2}$ and $A_2$. In this embodiment, all transducers are made in 0.1 μm thick aluminum vapor deposition film, and they have split fingers. Two of the second transducer groups are located on both sides of the first transducer group C, as a transducer group A and a transducer group B. They constitute an elastic surface wave filter of a three-transducer configuration coupled with the external load via parallel connections. The radiation conductance of the central transducer (the first transducer group C) is 4 mS. It is matched with the external signal source 2 (the internal conductance 3 is 20 mS) via the matching circuit 5. In FIG. 1B; 1 denotes a piezoelectric substrate, 2 a signal source, 3 the internal conductance of the signal source, 4 a load conductance, and 5 a matching circuit.

Figure 3:
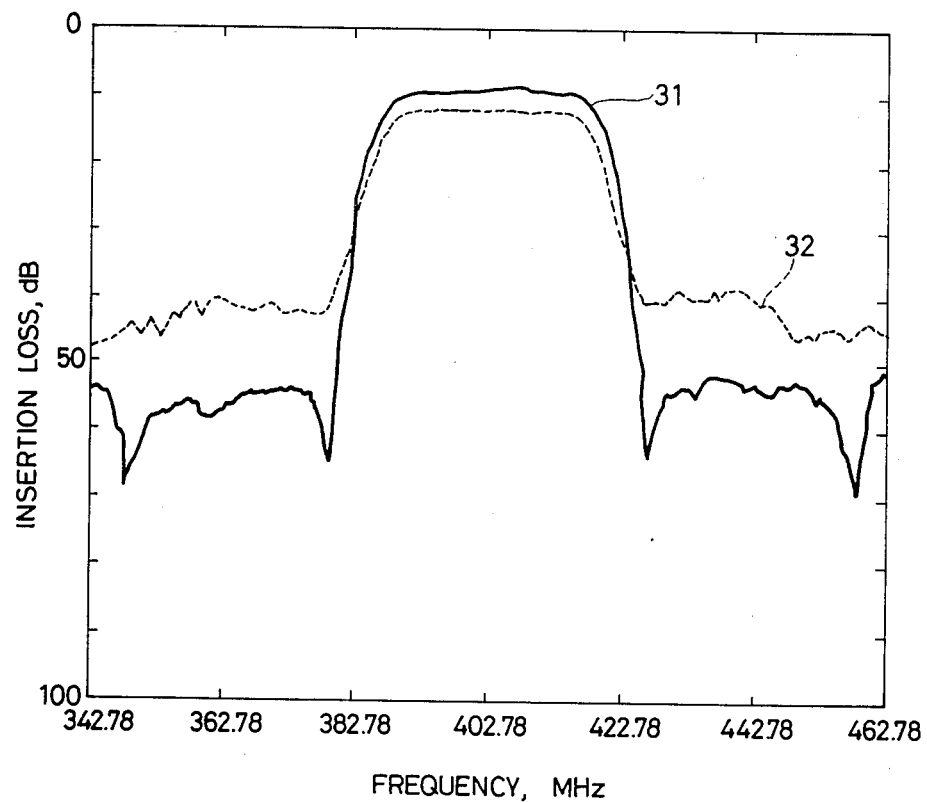
FIG. 3 is a drawing comparing the amplitude frequency characteristic of the embodiment of the present invention shown in FIG. 1B and that of an example of conventional transducer configuration.

The amplitude-frequency characteristic of this embodiment is compared with that of a conventional configuration (with the second transducer group comprising four pairs of large-bandwidth, unapodized transducers) in FIG. 3. As the characteristic curve 31 of this embodiment shows in FIG. 3, the stop-band rejection exceeds 40 dB. Furthermore, 40-dB rejection of multiple transit signals has been achieved in the entire 3-dB attention bandwidth with a bandwidth loss of 9 dB. In the case of the conventional configuration example, on the other hand, the magnitude of stop-band rejection is as small as 40 dB; and, even though 40-dB rejection of in-band multiple transit signals is possible, the loss reaches 13 dB as shown by the characteristic curve 32. With another example of conventional configuration which was also tested, it was possible to enhance stop-band rejection (to about 35 dB); but, in order to achieve 40-dB rejection of in-band multiple transit signals, it was necessary to make up the second transducer group with less-matching transducers, eventually causing the loss to reach about 13 dB. The superiority of this embodiment over the conventional configuration examples has been realized because the second transducer group used in this embodiment is extremely good at stop-band rejection with its stop-band rejection capability extending widely so as to enable the lower-order side lobes generated by the first transducer group to be adequately suppressed, whereas the bandwidth characteristic itself of the filter is so superior, in terms of shape factor and in-band flatness, so as to enable it to be defined by the second transducer group and also as to enable apodization on the first transducer group to be made exclusively for the purpose of realizing conjugate matching with the external matching circuit in the entire bandwidth.

As explained above according to the present invention; even when the bandwidth is relatively small and at high frequencies, the radiation conductance of the second transducer group can be reduced, whereas not only the bandwidth can be set with ease but also stop-band response signals near the main band can be suppressed by about 20 dB or more and also the ratio between the main-band width and stop-band width can be increased to about 2:1. Furthermore, since a filter having a rectangular frequency characteristic enables apodization to be made on the second transducer group itself, such a filter permits the first transducer group comprising apodized transducers to be designed with greater arbitrariness.

Therefore, if the present invention is applied to an elastic surface wave filter of a three-transducer configuration, 40-dB rejection of in-band multiple transit signals can be realized with a loss of 10 dB or less. Such arbitrariness allowed in designing the first transducer group enables the number of transducer pairs of the first transducer pairs of the first transducer group to be reduced by one third.

We claim:

1. An elastic surface wave device comprising a piezoelectric substrate, a first transducer group disposed on said substrate and at least one second transducer group located on at least one side of said first transducer group to exchange elastic surface waves with said first transducer group, said at least one second transducer group including a plurality of pairs of transducer means which share the same elastic surface wave propagation path, said plurality of pairs of transducer means being located symmetrically about a geometrical central position of said at least one second transducer group such that respective transducer means of each pair of transducer means are located on opposite sides of said central position, each pair of said transducer means including an equal number of pairs of transducer elements, a delay time between the centers of every two adjoining transducer means, excluding the two outermost transducer means, is always constant, and a delay time between the center of each of the two outermost transducer means and that of a transducer means adjoining either of said two outermost transducer means, if the number of pairs of transducer elements included in either of said outermost transducer means is an integer, is equal to an odd-number multiple of one half of said constant delay time, and if the number of pairs of transducer [pairs] elements included in either of said outermost transducer means is not an integer, is equal to an odd-number multiple of one half of said constant delay time plus or minus a quarter wavelength time delay, and electrical outputs of said transducer elements of said at least one second transducer group being arranged in one of series and parallel.

2. An elastic surface wave device according to claim 1, wherein said at least one second transducer group includes one second transducer group located on each side of said first transducer group, respectively, and first transducer group includes apodized transducers.

3. An elastic surface wave device comprising a piezoelectric substrate, a first transducer group disposed on said substrate and at least one second transducer group located on at least one side of said first transducer group to exchange elastic surface waves with said first transducer group, said at least one second transducer group including a plurality of pairs of transducer means which share the same elastic surface wave propagation path, said plurality of pairs of transducer means being symmetrically located about a geometrical central position of said at least one second transducer group such that respective transducer means of each pair of transducer means are located on opposite sides of said central position, each pair of such symmetrically located transducer means having equal numbers of finger pairs of transducer elements, a delay time between the centers of every two adjoining transducer means, excluding the two outermost transducer means, is always constant, and a delay time between the center of each of the two outermost transducer means and that of a transducer means adjoining either of said two outermost transducer means being equal to an odd-number multiple of one half of said constant delay time when the number of finger pairs of transducer elements included in either of said outermost transducer means is an integer, and equal to an odd-number multiple of one half of said constant delay time plus or minus a quarter wavelength time delay, when the number of finger pairs of transducer elements in the outermost transducer is not an integer.

4. An elastic surface wave device according to claim 3, wherein said at least one second transducer group includes one second transducer group located on each side of said first transducer group, respectively, and said first transducer group includes apodized transducers.

* * * * *